(12) United States Patent
Kerdiles et al.

(10) Patent No.: US 8,728,913 B2
(45) Date of Patent: *May 20, 2014

(54) METHOD FOR TRANSFERRING A LAYER FROM A DONOR SUBSTRATE ONTO A HANDLE SUBSTRATE

(71) Applicant: Soitec, Crolles Cedex (FR)

(72) Inventors: Sébastien Kerdiles, Saint Ismier (FR); Walter Schwarzenbach, Saint Nazaire les Eymes (FR); Aziz Alami-Idrissi, Le Touvet (FR)

(73) Assignee: Soitec, Bernin (FR)

( * ) Notice: Subject to any disclaimer, the term of this patent is extended or adjusted under 35 U.S.C. 154(b) by 0 days.

This patent is subject to a terminal disclaimer.

(21) Appl. No.: 13/933,779

(22) Filed: Jul. 2, 2013

(65) Prior Publication Data

US 2013/0295696 A1    Nov. 7, 2013

Related U.S. Application Data

(63) Continuation of application No. 12/712,938, filed on Feb. 25, 2010, now Pat. No. 8,476,148.

(30) Foreign Application Priority Data

Apr. 29, 2009   (EP) ..................................... 09290314

(51) Int. Cl.
*H01L 21/30*    (2006.01)
*H01L 21/78*    (2006.01)

(52) U.S. Cl.
USPC ........................................... 438/459; 438/458

(58) Field of Classification Search
None
See application file for complete search history.

(56) References Cited

U.S. PATENT DOCUMENTS

| 7,402,520 B2 | 7/2008 | Donohoe et al. |
| 8,476,148 B2* | 7/2013 | Kerdiles et al. ............... 438/459 |
| 2006/0099779 A1* | 5/2006 | Cayrefourcq et al. ........ 438/486 |
| 2006/0115986 A1 | 6/2006 | Donohoe et al. |
| 2007/0072393 A1 | 3/2007 | Aspar et al. |
| 2007/0087526 A1 | 4/2007 | Chhaimi et al. |
| 2008/0102601 A1 | 5/2008 | Bourdelle et al. |
| 2008/0303118 A1 | 12/2008 | Arena et al. |
| 2010/0279487 A1 | 11/2010 | Kerdiles et al. |

FOREIGN PATENT DOCUMENTS

| EP | 1026728 A2 | 8/2000 |
| EP | 1156531 A1 | 11/2001 |
| FR | 2852445 A1 | 9/2004 |
| FR | 2860842 A1 | 4/2005 |
| JP | 11297583 A | 10/1999 |
| WO | 2007017763 A2 | 2/2007 |

OTHER PUBLICATIONS

European Search Report for EP 09290314 dated Oct. 5, 2009, 6 pages.

* cited by examiner

*Primary Examiner* — Zandra Smith
*Assistant Examiner* — Pamela E Perkins
(74) *Attorney, Agent, or Firm* — TraskBritt

(57) ABSTRACT

The invention relates to a method for transferring a layer from a donor substrate onto a handle substrate wherein, after detachment, the remainder of the donor substrate is reused. To get rid of undesired protruding edge regions that are due to the chamfered geometry of the substrates, the invention proposes to carry out an additional etching process before detachment occurs.

19 Claims, 4 Drawing Sheets

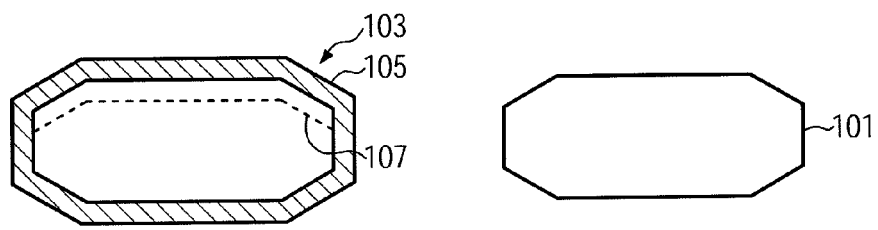
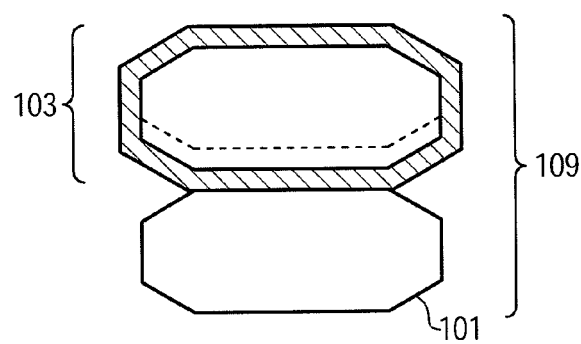
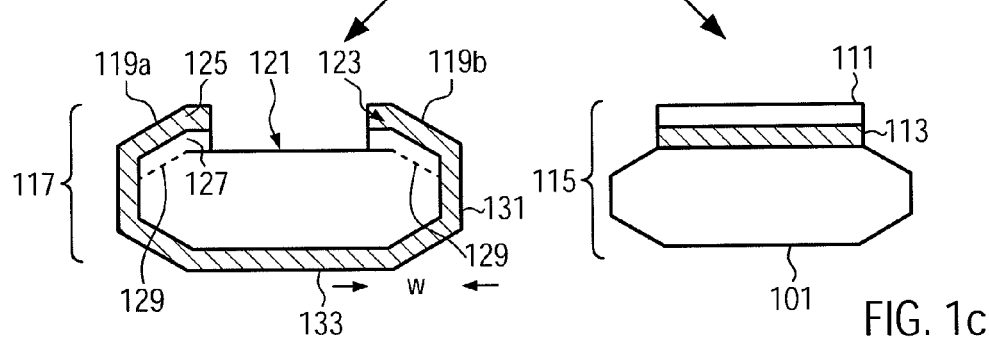
FIG. 1a
FIG. 1b
FIG. 1c

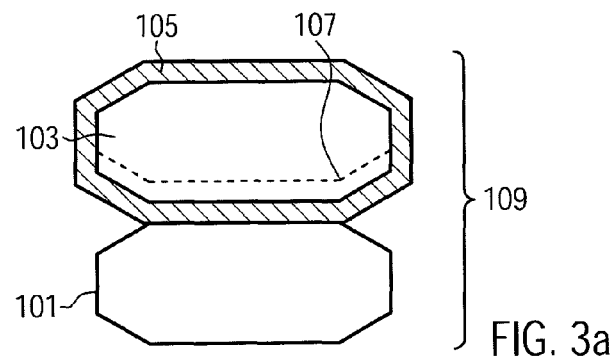
FIG. 3a
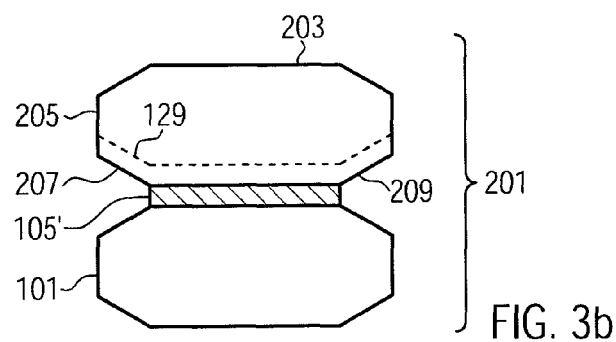
FIG. 3b
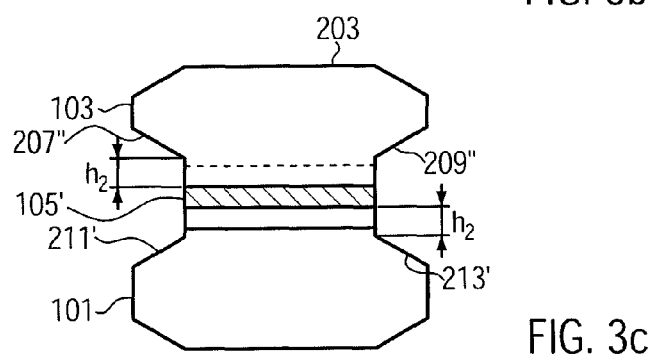
FIG. 3c
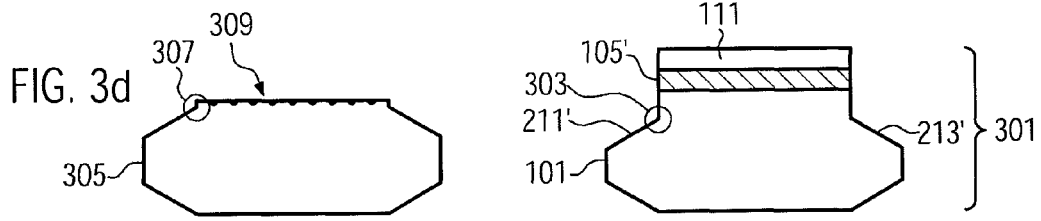
FIG. 3d
FIG. 3e

METHOD FOR TRANSFERRING A LAYER FROM A DONOR SUBSTRATE ONTO A HANDLE SUBSTRATE

CROSS-REFERENCE TO RELATED APPLICATION

This application is a continuation of U.S. patent application Ser. No. 12/712,938, filed Feb. 25, 2010, now U.S. Pat. No. 8,476,148, issued Jul. 2, 2013, which claims the benefit of the filing date of European Patent Application Serial No. EP09290314.5, filed Apr. 29, 2009, the entire disclosures of which are hereby incorporated herein by this reference.

TECHNICAL FIELD

The invention relates to a method for transferring a layer from a donor substrate onto a handle substrate and for reclaiming the surface of the donor substrate for reuse.

BACKGROUND

The so-called SMART CUT® process, illustrated in FIGS. 1a-1c provide high quality silicon-on-insulator (SOI) substrates. During this process (FIG. 1a), two substrates, called a handle substrate 101 and a donor substrate 103, usually Silicon wafers, undergo a certain number of process steps to transfer a layer with a given thickness of the donor substrate 103 onto the handle substrate 101. During the process, the donor substrate 103 is typically oxidized 105 to later on form the buried oxide layer (BOX) of the SOI structure, and an ion implantation step, during which ions like hydrogen or rare gas ions (He, Ar, etc.) are implanted into the donor substrate 103, is applied to form a predetermined splitting area 107 defining the to-be-transferred layer. Subsequently (FIG. 1b), the source substrate 103 is attached to the handle substrate 101, in particular via bonding taking advantage of Van der Waal's forces, to obtain a source-handle compound 109. Upon a mechanical and/or thermal treatment, a detachment of a semiconductor layer 111 together with a buried oxide layer 113 occurs at the predetermined splitting area 107 so that the two layers 111, 113 are transferred onto the handle substrate 101 to obtain the desired silicon-on-insulator structure 115 (FIG. 1c). The thickness of the layer 111 is determined by the energy of the implanted ions.

The remaining part 117 of the donor substrate 101, also called the negative, can be recycled and again used in the SMART CUT® type process as a new donor or handle substrate. The SMART CUT® type SOI fabrication process has a significant economic advantage due to this recycling process. Indeed, the process provides an optimized use of the raw material for instance silicon wafers.

The negative 117 (FIG. 1c) has a characteristic topography representing protruding residues 119a and 119b in an edge region, as illustrated in FIG. 1c, which corresponds to a region where no layer transfer occurred due to the chamfered shape of the edge of the initial wafers 103 and/or handle substrate 101. The surface of the negative 117 between the protruding residues 119a and 119b has a first inner region 121 at which detachment occurred to provide the transferred layer 111 on the handle substrate 101 and that has a rather rough surface typically close to 60 Å to 70 Å RMS as measured by atomic force microscopy (AFM), which is to be compared to 1 Å to 3 Å for standard silicon wafer. The edge of the remainder 117 with the protruding residues 119a and 119b actually has a chamfered shape and furthermore comprises a step-like structure 123 seen from the internal region 121 comprising the remaining part of the buried oxide layer 125 and the non-transferred silicon 127 over the remaining part of the ion implanted predetermined splitting area 129. The edge 131 and the back side 133 of the negative 117 are, by the way, also covered by the oxide.

The step 123 of the negative 117 typically has a thickness of about 100 Å to 10,000 Å of silicon, mostly between 1000 Å to 3000 Å, and 100 Å to 10,000 Å of silicon oxide and has a width w in the lateral direction of the order of 0.5 mm to 3 mm.

Prior to the reuse of the negative 117 as donor substrate 103 or handle substrate 101, the surface roughness of the inner region 121 needs to be reduced and the protruding residual topography 119a and 119b needs to be removed. The removal needs to be complete as any remaining protruding material can create particle contamination when during a thermal treatment an exfoliation in the chamfered region occurs due to the presence of the remaining ion implanted region 129. Methods to do so are, for example, known from EP 1 156 531 A1 and U.S. Pat. No. 7,402,520 B2. Typically, the following process is applied to get rid of the protruding residual topography: The reclaiming process of negative 117 starts with a de-oxidation step to remove the oxide layer 125 on top of the protruding residual topography 119, 119b on the edge of the remainder 117 as well as on the side 131 and on the back side 133. The de-oxidation can, for example, be carried out using a HF bath, wherein the acid consumes the oxide layer 125, the edge 131, and the back side 133. Subsequently, a first polishing step of the edge region of substrate 101 is carried out to at least partially remove the protruding silicon part 127 on the edge. Then a double-sided polishing (DSP) step is carried out to improve the surface roughness in the interior region 121 and also to further remove the step 123 in the direction of the protruding residual topography 119a and 119b, but also to remove residues remaining form the ion implantation. Finally, to obtain a suitable surface roughness on the front surface of the remainder 117, a chemical mechanical polishing step (CMP) is carried out.

Even though, it is possible to obtain a recycled substrate with the described reclaiming process and that can be reused in the SMART CUT® process, it is an object of the present invention to provide an improved and more economic reclaiming process that no longer needs the double-sided polishing step to reclaim the remainder of the donor substrate. Indeed, the DSP process step has the major disadvantage that, during polishing, up to 10 μm (5 μm on each side of the substrate) of material are removed to get rid of the protruding residual topography 119a and 119b.

This object is achieved with the method according to claim 1. Accordingly, the method comprises the steps of a) providing a donor substrate, in particular a semiconductor substrate, and a handle substrate, each with chamfered edge regions, b) forming a predetermined splitting area at a depth h inside the donor substrate, c) attaching, in particular by bonding, the donor and handle substrate to obtain a donor-handle compound, wherein no attaching occurs between the two substrates in the chamfered edge regions of the donor and handle substrates, then d) etching the chamfered region such that at least a layer of about the thickness h is removed from the donor substrate in the region where no attaching occurred, then e) detaching a remainder of the donor substrate from the donor-handle substrate, wherein detachment occurs at the predetermined splitting area, and f) reusing the remainder of the donor substrate, in particular after the surface treatment step. According to a preferred embodiment, during step d), a layer with a thickness of more than h is removed.

Thus, unlike in the process of the prior art, the remainder of the donor substrate will no longer present a protruding portion 119a, 119b as illustrated in FIG. 1c, as the chamfered area where no attachment occurs between the two attached substrates is removed prior to the detachment. By the fact that no longer are any protruding regions present at the surface of the remainder of the donor substrate, there is no need for carrying out the edge removal step and the double-sided polishing step that were mandatory in the prior art to get rid of the protruding portion. As a consequence, the reclaiming of the remainder of the donor substrate can be carried out in a much simpler way not needing expensive additional tools to carry out the edge polishing and the double-sided polishing process steps. At the same time, due to the suppression of the double-sided polishing step, the initial geometry of the donor substrates can be kept even if one donor substrate is used several times in a process as described above. In addition, due to the fact that the implanted region in the chamfered region is removed during step d), the quality of the obtained substrates is also improved as the risk of creation of particles during a raise in temperature leading to a partial removal of the chamfered region can be reduced.

Preferably, the method can use a donor substrate comprising a dielectric layer and, in this case, can furthermore comprise a step g) carried out between steps c) and d), which consists of removing the dielectric from the donor substrate at least in the chamfered region but not in the attached region. Thus, even in the presence of a dielectric used to form a semiconductor-on-insulator substrate with the mentioned process, it is still possible to achieve the advantages of the method as not only the chamfered region of the donor substrate itself, but also of its dielectric layer, is removed prior to detaching.

It has to be pointed out that the removal step to remove the dielectric layer does not represent an additional step that has to be carried out. Indeed, in the prior art, the dielectric layer is also removed during reclaiming. Thus, compared to the prior art, step g) is simply moved from after detachment to prior to detachment.

According to a variant, the handle substrate can comprise a dielectric layer. In this case, the dielectric layer is provided by the handle substrate to form a semiconductor-on-insulator substrate. This variant has the advantage that one only has to remove the material of the substrate in step d) to achieve the advantages of the invention, as no additional dielectric layer is provided on the donor substrate. Thus, in this variant, less process steps are necessary compared to the variant that provides the dielectric via the donor substrate.

Advantageously, the dielectric layer can be an oxide, in particular a silicon oxide. This oxide layer can be provided either by a thermal process or by deposition. Advantageously, steps e) and/or g) can be wet or dry etching steps. This is a more economic material removal step than the edge polishing and double-sided polishing step as used in the prior art.

Preferably, steps e) and g) can be performed using a non-selective and/or isotropic etching solution. Using the non-selective etching process, both the dielectric layer and the underlying part of the donor substrate, for instance a semiconductor material, can be removed in one step. By using an isotropic etching solution, the process is furthermore simplified as varying etching rates, depending on the crystallographic directions that are different in the chamfered region compared to the rest of the substrate, do not have to be taken into account. This simplifies the control of the process.

The dielectric material removal step, independent of whether the dielectric layer is removed from the donor and/or the handle substrate (in case a dielectric is also present on the handle substrate), does not have an impact on the quality of the buried dielectric layer as this one is sandwiched between donor and handle substrates.

Advantageously, during step d), a layer with a thickness of about 100 Å to 10,000 Å, in particular 1000 Å to 3000 Å, can be removed in the non-attached region of the donor substrate. Compared to the double-sided polishing step mandatory in the prior art during which a large amount of material, namely in the order of 5 μm on each side, had to be removed to get rid of the protruding portions, the material removal in the process according to the invention can be less so that one donor substrate can be reused more often, for instance, more than ten times, compared to the prior art process. This is also made possible by the fact that the reclaimed donor substrate remains within the semi-standard concerning the substrate dimensions.

Preferably, steps d) and/or g) can be carried out at a temperature of less than 500° C., preferably at less than 350° C. Thus, the whole process until detachment is carried out at low temperature so that no detachment can occur in the non-attached regions that could lead to unwanted particle contamination of the final product.

According to a preferred embodiment, the surface treatment step can, at most, comprise a polishing step, in particular a CMP polishing and a cleaning step before and/or after the polishing step. Thus, compared to the prior art, a greatly simplified reclaiming process can be carried out. The polishing step is used to get the desired surface quality of the reclaimed remainder of the donor substrate, typically a mirror polished quality, and the cleaning steps, as known in the art, make the reclaimed donor substrate ready for reuse. Thus, instead of a three-level reclaiming process: i) edge polishing, ii) double-sided polishing, and iii) mirror polishing plus the various cleaning steps, the invention provides the possibility to carry out the reclaiming process with only one simple mirror polishing step.

In this context, the term "about the thickness h" used in claim 1 relates to a thickness that is such that the remainder can be planarized using only a CMP process. This means that a layer is removed in step d) of claim 1 that has a thickness of at least h minus about 50 nm. This would lead to a protruding region in the remainder of the donor substrate with a height of about 50 nm, which can be dealt with by a simple CMP polishing step.

Advantageously, during CMP polishing, a layer of less than 3 μm, preferably less than 1 μm, can be removed from the surface where detachment occurred. As mentioned above, this limited material removal brings the advantage that one donor substrate can be reused more often, in particular, more than ten times, in the layer transfer process.

Advantageous embodiments will be described in combination with the enclosed Figures.

BRIEF DESCRIPTION OF THE DRAWINGS

FIGS. 1a through 1c illustrate a prior art layer transfer process according to the SMART CUT® technology;

FIGS. 3a through 3e illustrate a second embodiment of the inventive method; and

DETAILED DESCRIPTION

Figure 2A:
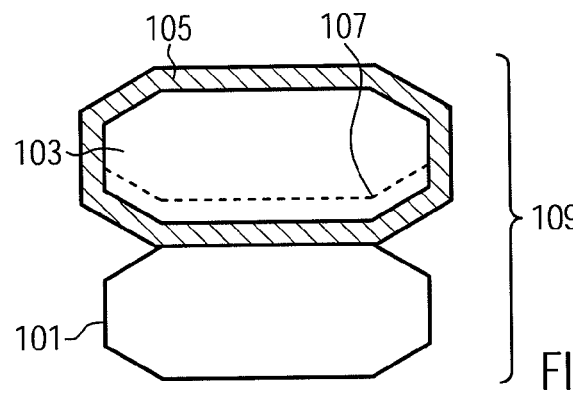
FIGS. 2a through 2d illustrate a first embodiment of the inventive method.

FIGS. 2a through 2d illustrate a first embodiment of the inventive method for transferring a layer from a donor substrate onto a handle substrate. FIG. 2a illustrates the source-handle compound 109, as already illustrated in FIG. 1b. This source-handle compound 109 has all the properties as already described above in the introduction and is, therefore, not described in detail again, but reference is made to FIGS. 1a through 1c.

It should nevertheless be mentioned that the handle substrate 101 can be any suitable handle substrate, in particular a silicon wafer, but also a glass or quartz type substrate. The donor substrate 103 can be a semiconductor substrate, in particular one out of a silicon, a silicon carbide, a silicon germanium, a gallium nitride or a germanium substrate and the isolating dielectric layer 105 can be one out of silicon dioxide, silicon nitride, silicon oxynitride or $Al_2O_3$, etc.

In the following, the inventive method will be described, without being limited to this particular choice, to a handle substrate 101 being a silicon wafer, a donor substrate 103 being a silicon wafer and the dielectric layer 105 being a silicon dioxide.

Figure 2B:
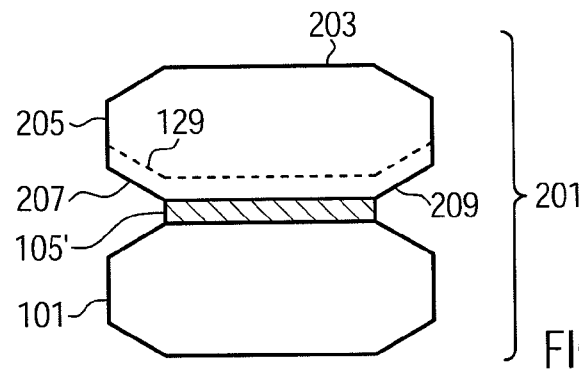

FIG. 2b illustrates the source-handle compound 201 obtained after an etching step during which the dielectric layer 105 has been removed from the back side 203, the side 205 but also the chamfered regions 207 and 209 of the donor substrate. A dielectric layer 105' remains sandwiched between the donor substrate 103 and the handle substrate 101 and forms the future buried oxide layer.

In this embodiment, the material removal is achieved with an etching step. The etching can be a dry or a wet etching suitable to remove the dielectric oxide layer, which typically has a thickness of up to 1000 nm, but typically has a thickness of 10 nm to 200 nm.

Figure 2C:
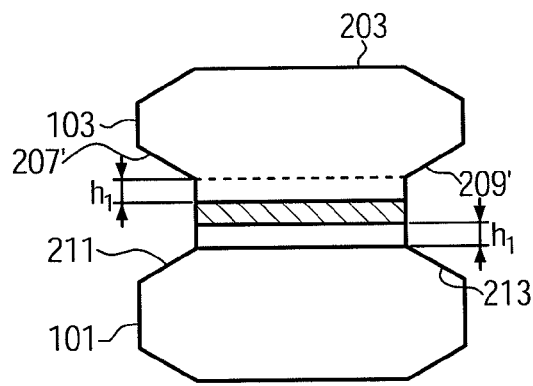

Subsequently, as illustrated in FIG. 2c, an additional etching step is carried out to remove the silicon present in the chamfered regions 207' and 209'. The etching step can again be a wet or dry etching and is preferably an isotropic etching, for instance, using a wet etch with $HF/HNO_3$ or a dry etch using a plasma. According to a variant the dielectric etching and the semiconductor etching are carried out using the same process.

The etching is carried out such that material is removed from the chamfered regions 207' and 209' at least of the donor substrate 103 and such that the removed layer has a thickness $h_1$ corresponding to the depth h of the predetermined splitting area 107. Typically the material removal not only occurs in the chamfered regions 207' and 209' but also on the side 205 and on the back side 203 of the donor substrate 103 and also in chamfered regions 211 and 213 of the handle substrate 101.

By doing so, the ion implanted region 129, present in the chamfered regions 207 and 209 illustrated in FIG. 2b, of the donor substrate 103 is removed.

Figure 2D:
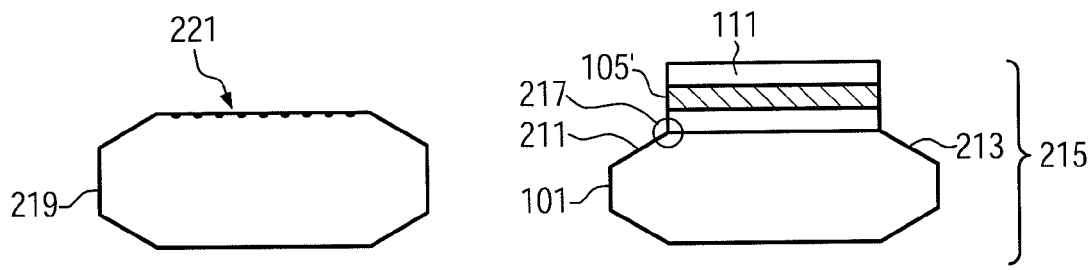

The next step consists of a detachment step, the result of which is illustrated in FIG. 2d and that is carried out in the same way as described in the introduction, thus either using mechanical and/or thermal energy. After detachment, a semiconductor-on-insulator, here silicon-on-insulator substrate 215, as illustrated on the right hand side of FIG. 2d, is obtained. This structure 215 comprises the handle substrate 101, the transferred oxide layer 105' and the transferred silicon layer 111 from the donor substrate 103. Due to the etching process, the substrate 215 further comprises a step-like shoulder 217 in the chamfered edge regions 211 and 213 of the handle substrate 101, which makes the geometry of semiconductor-on-insulator substrate 215 slightly different compared to the one illustrated in FIG. 1c.

The effect of the inventive method is even more visible on a remainder 219 of the donor substrate 103 illustrated on the left hand side of FIG. 2d. The remainder of the donor substrate 219, according to the invention, no longer has a protruding portion in its edge region, which is in complete contrast to the structure 117 according to the prior art illustrated in the left hand side of FIG. 1c in the prior art.

The surface part 221 where detachment occurred has a rather rough surface, with roughness values close to 60 Å to 70 Å like in the prior art. However, due to the fact that the protruding portion is not present, the surface roughness can be improved by a simple CMP polishing process during which less than 3 μm, preferably less than 1 μm, or even only about 50 nm, of material is removed from the surface to obtain the desired surface quality for reuse of the reclaimed remainder 219.

The chemical/mechanical polishing step can be accompanied by standard cleaning processes as in the prior art.

Compared to the prior art, the method according to the first embodiment has the advantage that, after detachment, no protruding portions are present in the edge regions, which is in complete contrast with the prior art (see reference numerals 119a, 119b in FIG. 1c). As a consequence, the reclaiming process to recondition the remainder of the donor substrate 219 such that it can be reduced is greatly simplified. No edge polishing and no double-sided polishing are necessary anymore and a simple CMP process is sufficient to obtain the desired surface quality properties, eventually accompanied by one or two cleaning steps. Thus, the recycling process is not only cheaper to carry out, as less equipment is necessary for the process, but also one donor substrate can be reused more often. Whereas, typically 10 μm of material had to be removed in the prior art process, the inventive process can be carried out with a greatly reduced material removal of the order of less than 3 μm, typically 0.5 μm to 1 μm. It is even possible to carry out the reclaiming process by only removing about 50 nm from the surface 221. Thus, one donor substrate 103 can be recycled more often than in the prior art, namely about at least 10 times. Due to the fact that no DSP is necessary, the geometry of the initial substrate can be kept. Besides, another important advantage is that the creation of particles during step e), i.e., thermal treatment leading to the detachment or any subsequent thermal treatment step, can be prevented or at least reduced, as in the chamfered region the remaining ion implanted part is removed so that it cannot explode away during a subsequent thermal treatment and thus the creation of undesired particles can be reduced or even prevented.

FIGS. 3a through 3e illustrate a second embodiment of the inventive method for transferring a layer of a donor substrate 103 onto a handle substrate 101. FIG. 3a again illustrates the source-handle compound 109, the description thereof is not repeated again but incorporated herewith by reference to the description of FIG. 2a. The same is valid for FIG. 3b, illustrating the resulting structure 201 after the dielectric material removal step.

The difference between the first embodiment and the second embodiment is that, during the etching of chamfered regions 207'' and 209'' of the donor substrate 103, the material removal goes beyond the depth of the predetermined splitting areas 107, 129, as illustrated in FIG. 3c, by reference numeral $h_2$. Again, the predetermined splitting area 107 is still present within the donor substrate 103. As a consequence of the longer etching process, the material removal in the chamfered regions 211' and 213' of the handle substrate 101 is of the order of $h_2$.

Compared to the first embodiment, the additional material removal has the advantage that it is ensured that all implanted areas 129 present in the chamfered region 207 and 209 are removed.

After the detachment step, a semiconductor-on-insulator substrate 301, as illustrated on the right hand side of FIG. 2d, is obtained that essentially corresponds to the SOI substrate 215 illustrated on the right hand side of FIG. 2d. However, a step-like region 303 at the transition between the chamfered regions 211' and 213' and the buried oxide layer 105' is higher ($h_2$) than in the semiconductor-on-insulator substrate 215 of FIG. 2d.

Unlike the remainder 217 illustrated in FIG. 2d, a remainder of the donor substrate 305 in this embodiment also has a step-like shoulder 307 with a step height $h_2$. However, like in the first embodiment, a surface 309 at which detachment occurred still carries defects due to the ion implantation and thus needs to be polished. In the second embodiment, the polishing step is carried out such that the step-like structure 307 is removed so that a ready to reuse donor substrate 311, as illustrated in FIG. 3e, is obtained. This substrate 311 is again flat, except for the chamfered region, which is like in the original substrate 103, except for a reduced thickness.

With the second embodiment, the same advantages can be achieved as with the first embodiment.

According to a variant of the invention, instead of providing a semiconductor-on-insulator substrate, the process could be carried out without an intervening dielectric layer, which is called a direct silicon bonding process. In this case, the first and second embodiments could be carried out without the step of removing the dielectric 105, as illustrated in FIGS. 2b and 3b.

FIGS. 4a through 4d illustrate a third embodiment of the invention. This embodiment is slightly different compared to the first and second embodiments as, here, the dielectric layer is provided on the handle substrate side and the donor substrate is a bare semiconductor wafer, for instance a silicon wafer. The materials that can be used in this embodiment correspond to the ones of the first and second embodiment.

Figure 4A:
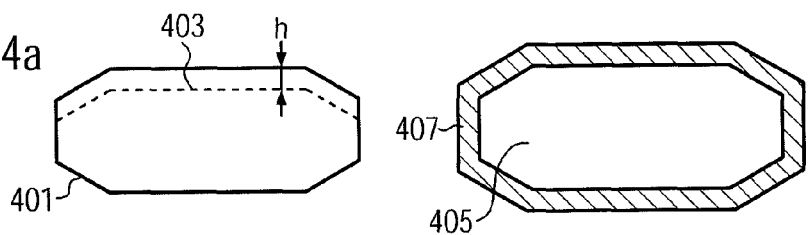
FIGS. 4a through 4d illustrate a third embodiment of the inventive method.

The left side of FIG. 4a illustrates a donor substrate 401 with a predetermined splitting area 403 and the right side of a handle substrate 405, which in this case also comprises a dielectric layer, for instance silicon oxide, 407.

Figure 4B:
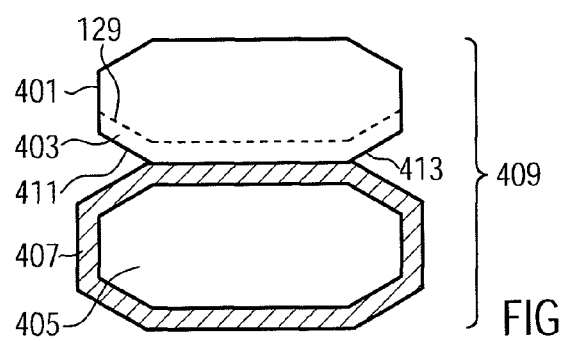

FIG. 4b illustrates a source handle compound 409 achieved by bonding the donor and handle substrates 401 and 405. Like in the first and second embodiments on the surface side where bonding occurred, nonattached regions 411 and 413 can be observed, which is due to the chamfered edge region of both substrates.

Figure 4C:
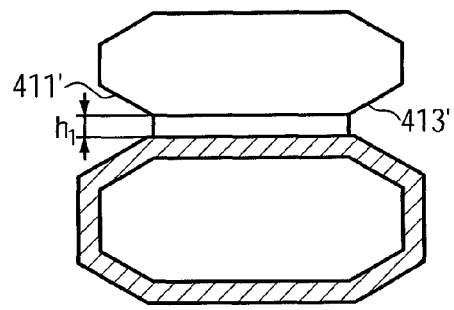
Figure 4D:
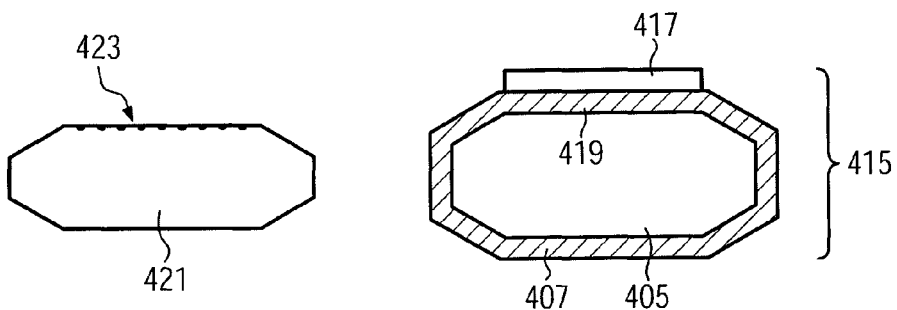

Subsequently, and as illustrated in FIG. 4c, an etching step is carried out to remove a layer of thickness $h_1$ corresponding to the depth h of the predetermined splitting area 403 is removed in nonattached edge regions 411' and 413'. Thus, like in the first and second embodiments, the ion implanted region 129 in the edge region of the donor substrate 401 is removed by this step. As the donor substrate 401 is not covered by the dielectric layer, which is in contrast to the first and second embodiments, no oxide removal step is necessary in this embodiment.

After detachment, achieved by a thermal and/or mechanical treatment, a SOI substrate 415 is obtained comprising a transferred layer 417 and a buried oxide layer 419 still part of the original dielectric layer 407 covering the handle substrate 405. Eventually a deoxidation step could be carried out to remove the dielectric layer 407 except for the buried part 419 to obtain a SOI substrate 415 as illustrated in FIG. 2d or 3d.

The remainder 421 of the original donor substrate 401 has the same structure than the one illustrated in FIG. 2d. A simple CMP polishing process is sufficient to remove the defects on the surface 423 where detachment occurred.

Finally, according to a variant, the material removal step illustrated in FIG. 4c could also be carried out such that a thickness $h_2$ is removed that is larger than the depth h of the predetermined splitting area 403, just like in the second embodiment.

According to a variant, the first through third embodiments can also be carried out without the presence of a buried oxide layer 105'. In the so-called direct silicon bonding technology, two Si wafers, typically one with a (100) and the other one with a (110) surface, are bonded together. In this case, the process described is carried out in the same way without the step of removing the oxide by etching. It should furthermore be mentioned that by CMP a remaining protruding portion of about 50 nm, which could be present in the edge region in case the material removal did not go up until h or beyond, can still be removed.

In the following practical examples according to the invention will be described.

Example one according to the invention: a silicon-on-insulator substrate with a buried thermal oxide of thickness 145 nm and a transferred layer of thickness 250 nm is achieved using an etching process of the source handle substrate as illustrated in FIG. 2b. In this example the oxide is etched using HF and then the Si is etched using $HF/HNO_3$ such that $h_1=h=250$ nm+/−5%. The remainder of the donor substrate is recycled using a CMP process removing a layer with thickness of 0.5 μm. In this example a two step selective etching is carried out: first the HF removes the oxide but does not etch Si, and the second bath using HF/HNO3 eventually buffered using $CH_3COOH$ acid etches the silicon.

Example two according to the invention: a silicon-on-insulator substrate with a buried thermal oxide of thickness 145 nm and a transferred layer of thickness 300 nm is achieved using an etching process with $HF/H_2O_2/H_2O$ and $h_1=250$ nm, with h being 300 nm. The recycling of the remainder is carried out by an EP and CMP step. In this example the $HF/H_2O_2$ bath is not selective and both layers, the oxide and the silicon, can be etched in one step. Edge polishing is performed to get rid of any potential residue of the implanted layer on the edge since material removal did not go up until h or beyond ($h_1$~h−50 nm), but the remaining 50 nm can also be removed with a CMP step and no EP polishing.

Example three according to the invention: a silicon-on-insulator substrate with a buried thermal oxide of 10 nm thickness and a transferred layer of 250 nm is achieved using a plasma (dry) etch such that $h_1=h=250$ nm+/−5%. During the dry etch, a first plasma based on $CF_4$ or $CHF_3$ etches the oxide and then a second plasma on the basis of $SF_6$ etches the silicon. In this case, one of the two substrates, preferably the donor substrate, has one of its main surfaces, called the back surface, on a substrate holder that prevents etching of the back side. In this case, the reclaiming of the remainder of the donor substrate comprises an additional deoxidation step to remove the oxide from the back side plus the CMP step polishing the front surface and removing about 1 μm of silicon.

Example four according to the invention: a silicon-on-insulator substrate with a 145 nm buried insulator layer comprising $SiO_xN_y$ and one or more $SiO_2$ layers, etched using HF and $H_3PO_4$ and then HF/HNO3 such that $h_1=h=250$ nm+/−5%.

What is claimed is:
1. A method of transferring a layer from a donor substrate onto a handle substrate and for reclaiming a surface of the donor substrate for reuse, comprising:
   providing a semiconductor donor substrate and a handle substrate, each comprising a chamfered edge region;

forming a predetermined splitting area at a depth inside the donor substrate;

bonding the donor substrate and the handle substrate to obtain a donor-handle compound structure, wherein no bonding occurs between the donor substrate and the handle substrate in the chamfered edge regions of the donor substrate and the handle substrate;

after bonding the donor substrate and the handle substrate, performing an etching process on the donor substrate and removing a layer of the donor substrate from the chamfered region of the donor substrate having a thickness of at least about the depth at which the splitting area is formed inside the donor substrate, the removed layer of the donor substrate including a portion of the predetermined splitting area in the chamfered edge region of the donor substrate;

after performing the etching process on the donor substrate, detaching a remainder of the etched donor substrate from the donor-handle compound structure at the predetermined splitting area;

treating a surface of the remainder of the etched donor substrate, wherein treating a surface of the reminder comprises performing only a single chemical-mechanical polishing process on the surface of the remainder of the etched donor substrate; and reusing the remainder of the etched donor substrate.

2. The method of claim 1, wherein treating the surface of the remainder of the etched donor substrate further comprises cleaning the surface of the remainder of the etched donor substrate.

3. The method of claim 1, wherein performing only the single chemical-mechanical polishing process on the surface of the remainder of the etched donor substrate comprises removing a layer having a thickness of less than 3 μm from the surface of the remainder of the etched donor substrate.

4. The method of claim 3, wherein removing the layer having the thickness of less than 3 μm from the surface of the remainder of the etched donor substrate comprises removing a layer having a thickness of less than 1 μm from the surface of the remainder of the etched donor substrate.

5. The method of claim 4, wherein removing the layer having the thickness of less than 1 μm from the surface of the remainder of the etched donor substrate comprises removing a layer having a thickness of less than 50 nm from the surface of the remainder of the etched donor substrate.

6. The method of claim 1, wherein the donor substrate comprises a dielectric layer, and wherein the method further comprises, prior to performing the etching process on the donor substrate, removing the dielectric layer from the donor substrate at least in the chamfered region of the donor substrate but not in a region of the donor substrate bonded to the handle substrate after bonding the donor substrate and the handle substrate.

7. The method of claim 1, wherein the handle substrate comprises a dielectric layer.

8. The method of claim 7, wherein the dielectric layer of the donor substrate comprises an oxide.

9. The method of claim 1, wherein performing the etching process on the donor substrate comprises using at least one of a wet etching process and a dry etching process to etch the donor substrate.

10. The method of claim 9, wherein using the at least one of the wet etching process and the dry etching process to etch the donor substrate comprises using at least one of a non-selective etching solution and an etching solution.

11. The method of claim 1, wherein performing the etching process on the donor substrate and removing the layer from the donor substrate comprises removing a layer from the donor substrate having a thickness of about 100 Å to about 10,000 Å in the chamfered region of the donor substrate.

12. The method of claim 11, wherein performing the etching process on the donor substrate and removing the layer from the donor substrate comprises removing a layer from the donor substrate having a thickness of about 1,000 Å to about 3,000 Å in the chamfered region of the donor substrate.

13. The method of claim 1, wherein performing the etching process on the donor substrate comprises etching the donor substrate at a temperature of less than about 500° C.

14. The method of claim 13, wherein performing the etching process on the donor substrate and removing the layer from the donor substrate comprises etching the donor substrate at a temperature of less than about 350° C.

15. A method of transferring a layer from a donor substrate onto a handle substrate and for reclaiming a surface of the donor substrate for reuse, comprising:

providing a semiconductor donor substrate and a handle substrate, at least the donor substrate comprising a chamfered edge region;

forming a predetermined splitting area at an average first depth inside the donor substrate;

bonding the donor substrate and the handle substrate without bonding the chamfered edge region of the donor substrate to the handle substrate;

while the donor substrate remains bonded to the handle substrate, etching at least one exposed surface of the donor substrate and removing material from the at least one exposed surface of the donor substrate to an average second depth that is greater than the average first depth and removing a portion of the predetermined splitting area in the chamfered edge region of the donor substrate;

detaching the etched donor substrate from the handle substrate at the predetermined splitting area after etching the at least one exposed surface of the donor substrate and transferring a portion of the donor substrate to the handle substrate; and smoothing a surface of the donor substrate after detaching the etched donor substrate from the handle substrate at the predetermined splitting area.

16. The method of claim 15, further comprising transferring an additional portion of the donor substrate to another handle substrate after smoothing the surface of the donor substrate.

17. The method of claim 15, wherein smoothing the surface of the donor substrate comprises performing only a single chemical-mechanical polishing process on the surface of the donor substrate.

18. The method of claim 17, wherein performing only the single chemical-mechanical polishing process on the surface of the donor substrate comprises removing a layer having a thickness of less than 3 μm from the surface of the donor substrate.

19. The method of claim 18, wherein removing the layer having the thickness of less than 3 μm from the surface of the donor substrate comprises removing a layer having a thickness of less than 1 μm from the surface of the donor substrate.

* * * * *